United States Patent [19]
Goldstein et al.

[11] Patent Number: 5,494,439
[45] Date of Patent: Feb. 27, 1996

[54] SI/SIC COMPOSITE MATERIAL AND METHOD FOR MAKING SI/SIC COMPOSITE MATERIAL

[75] Inventors: Michael Goldstein; Cari H. Shim, both of Sunnyvale, Calif.

[73] Assignee: Intel Corporation, Santa Clara, Calif.

[21] Appl. No.: 217,363

[22] Filed: Mar. 24, 1994

Related U.S. Application Data

[62] Division of Ser. No. 128,839, Sep. 29, 1993, Pat. No. 5,417,803.

[51] Int. Cl.$^6$ .................................................. C03C 15/00
[52] U.S. Cl. ...................... 432/253; 432/152; 156/662.1; 427/344; 427/374.4; 427/404; 427/275
[58] Field of Search .................... 432/253, 241, 432/5.6, 156; 156/662.1; 427/344, 374.4, 404

[56] References Cited

U.S. PATENT DOCUMENTS

| | | | |
|---|---|---|---|
| 2,964,823 | 12/1960 | Fredriksson | 25/156 |
| 3,951,587 | 4/1976 | Alliegro et al. | 432/253 |
| 4,610,628 | 9/1986 | Mizushine | 432/124 |
| 4,761,134 | 8/1988 | Foster | 432/253 |
| 4,836,965 | 6/1989 | Hayashi et al. | 264/60 |
| 4,921,554 | 5/1990 | Bates et al. | |
| 4,955,808 | 9/1990 | Miyagawa | 432/253 |
| 4,957,811 | 9/1990 | Benker et al. | |
| 4,969,592 | 11/1990 | Yarahmadi et al. | |
| 4,998,879 | 3/1991 | Foster et al. | 432/253 |
| 4,999,228 | 3/1991 | Matsumoto et al. | 432/253 |
| 5,178,534 | 1/1993 | Bayne et al. | 432/11 |
| 5,236,875 | 8/1993 | Trigg et al. | 501/89 |
| 5,249,960 | 10/1993 | Monoe | 432/241 |
| 5,283,089 | 2/1994 | Bates | 432/253 |
| 5,310,339 | 5/1994 | Ushikawa | 432/253 |
| 5,330,352 | 7/1994 | Watanabe et al. | 432/152 |

OTHER PUBLICATIONS

Malcoml E. Washburn and William S. Coblenz, "Reaction–Formed Ceramics," Cermaic Bulletin, vol. 67, No. 2, 1988, pp. 356–363.

Yet–Ming Chiang, John S. Haggerty, Robert P. Messner, and Chrysanthe Demetry, "Reaction–Based Processing Methods For Ceramic–Matrix Composites," Ceramic Bulletin, vol. 68, No. 2, 1989, pp. 420–428.

*Primary Examiner*—Weilun Lo
*Attorney, Agent, or Firm*—Blakely, Sokoloff, Taylor & Zafman

[57] ABSTRACT

A silicon/silicon carbide material which eliminates contamination by outgassing and direct contact is described as well as wafer processing pans made of this material and wafer processing methods using the silicon/silicon carbide material. An ultraclean silicon/silicon carbide material may be formed by first forming a Si/SiC part by prior art methods. The Si/SiC part then is subjected to a temperature sufficient to cause the impurities within the silicon carbide to either react and/or diffuse into the silicon fill. The contaminated silicon fill is then removed, either by high temperature evaporation or by a chemical etch. Clean silicon is then impregnated within the pore space of the silicon carbide pan. The part which results has ultraclean silicon and silicon carbide grains which have most, if not all, of the impurities removed from the surface of the grains. Thus, an ultraclean material results which will not outgas or directly contaminate silicon wafers.

5 Claims, 6 Drawing Sheets

FIG_1
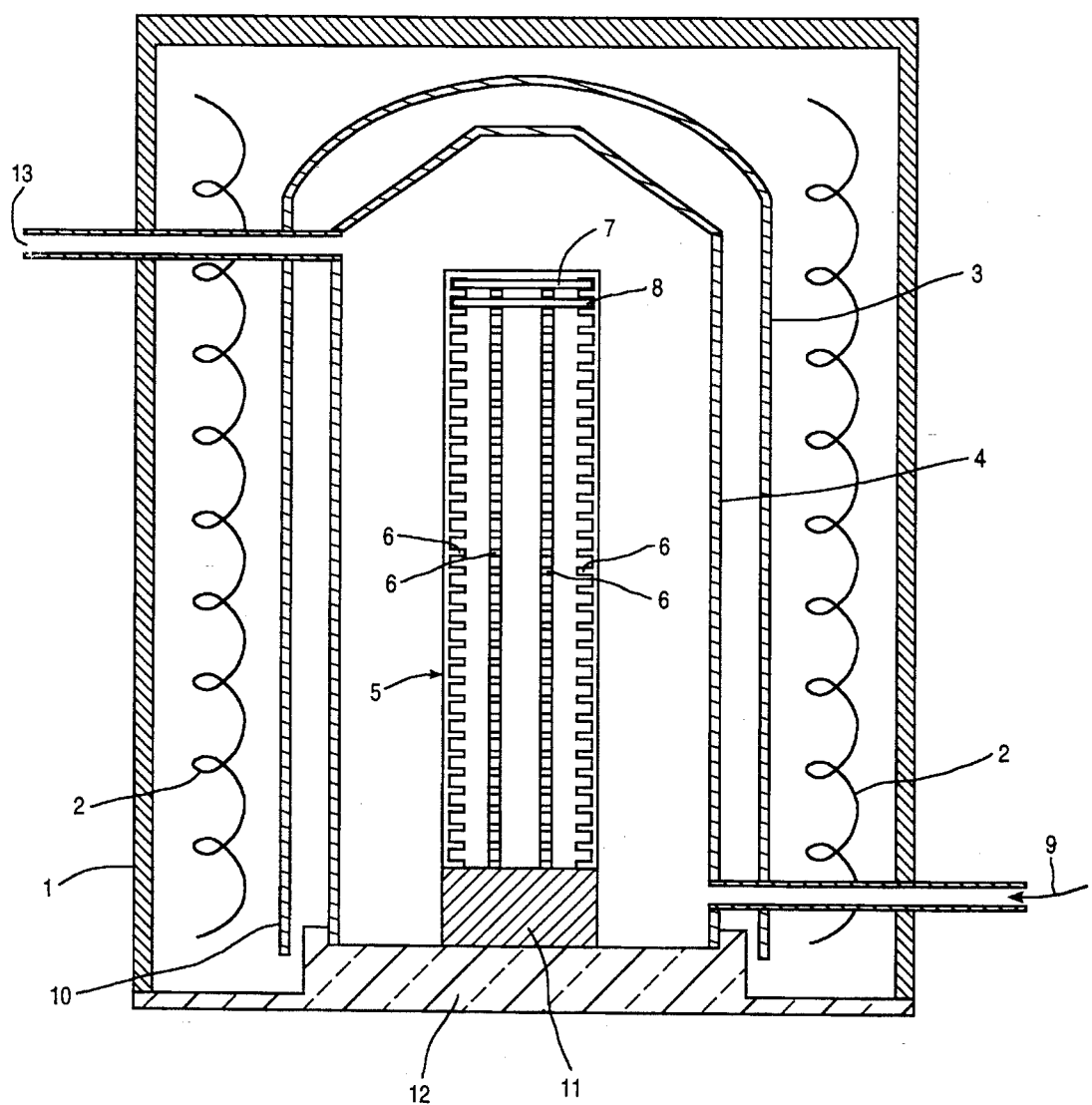

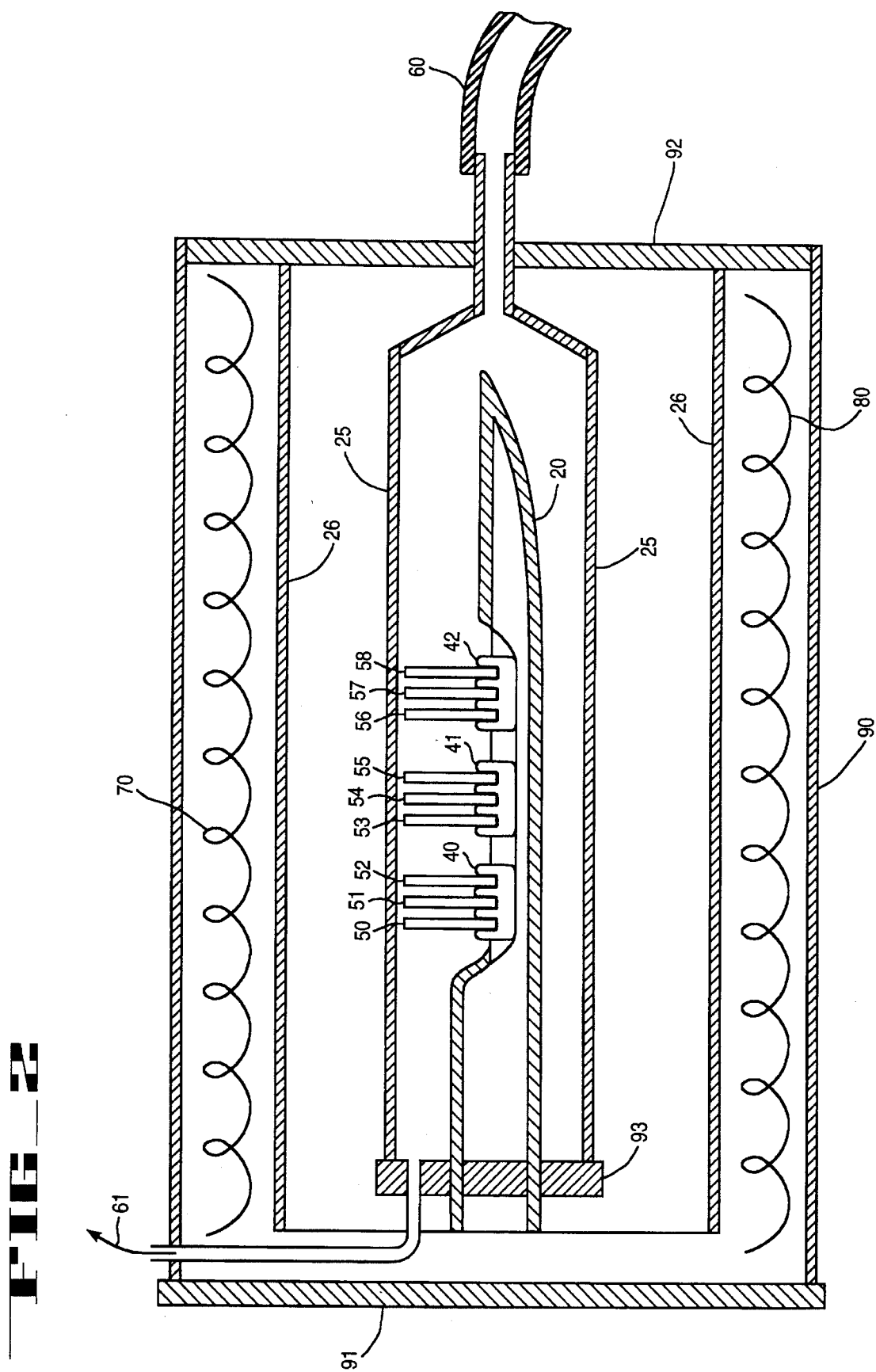
FIG_2

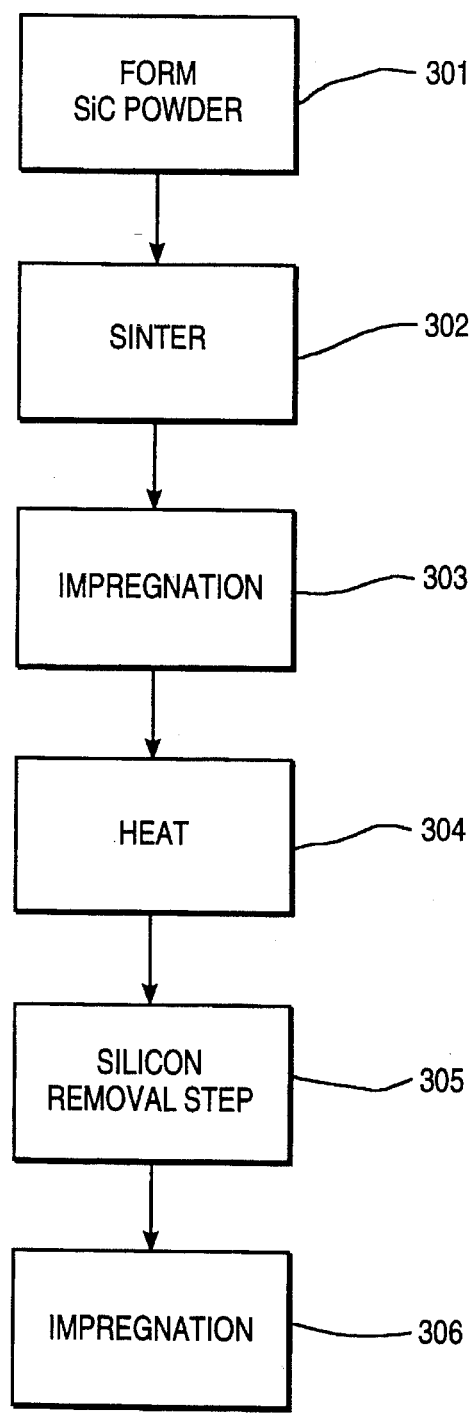
FIG_3

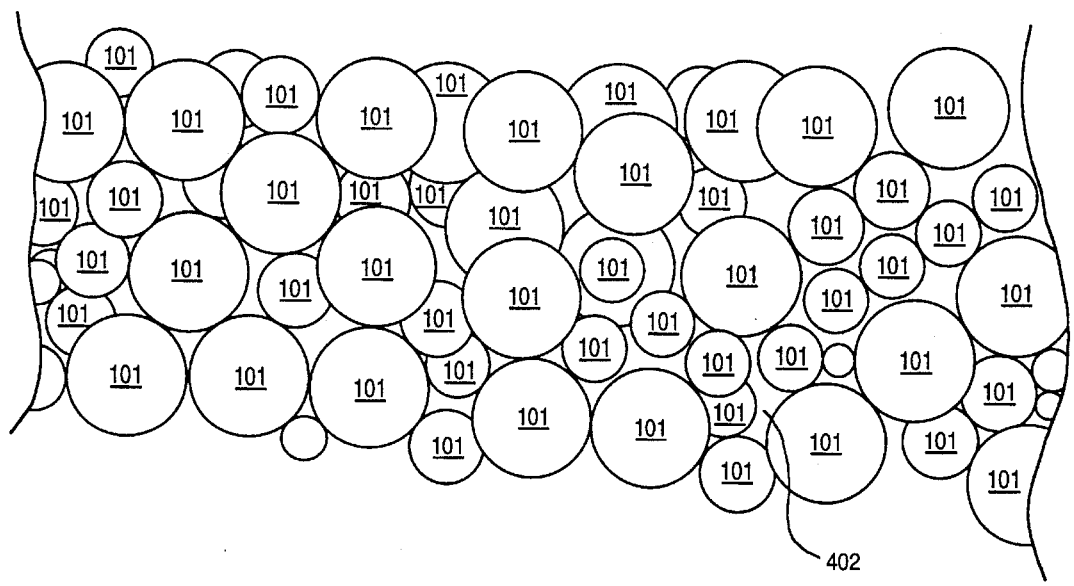
FIG_4
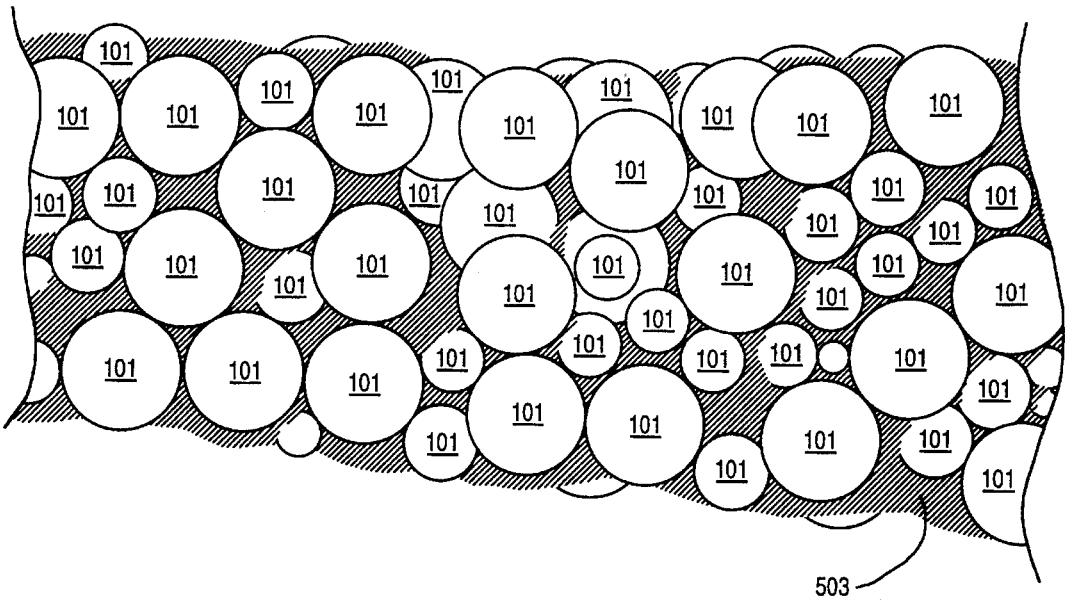
FIG_5

FIG_6
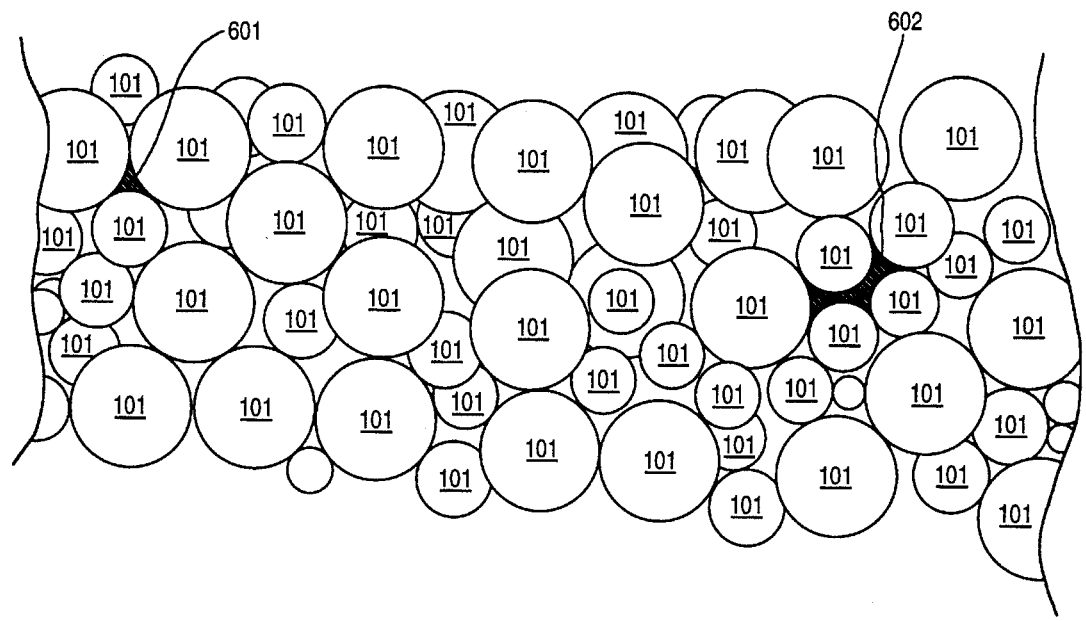
FIG_7
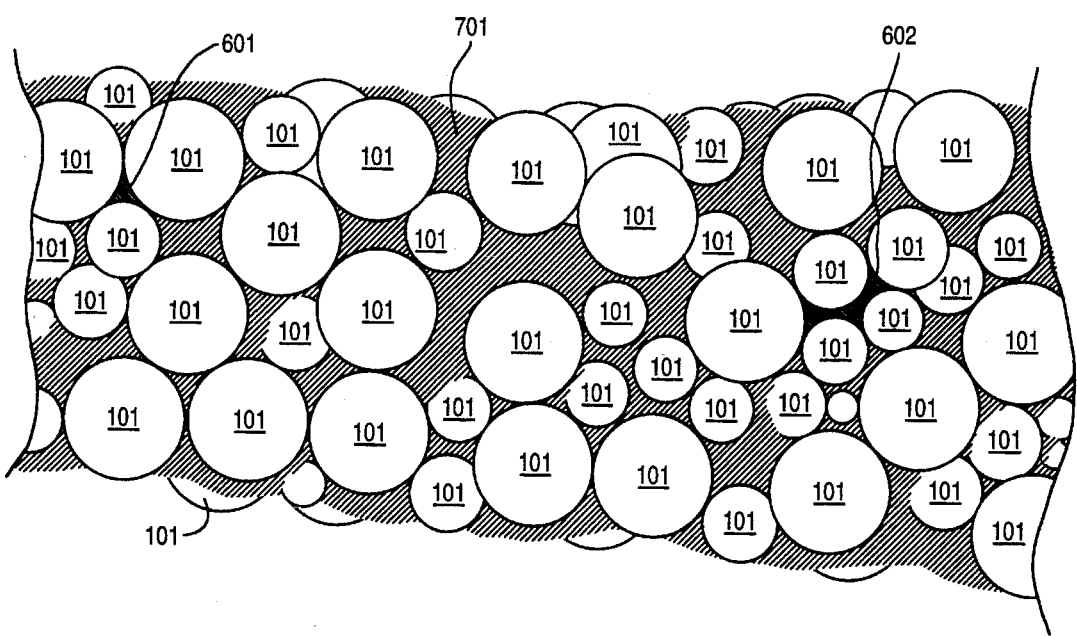

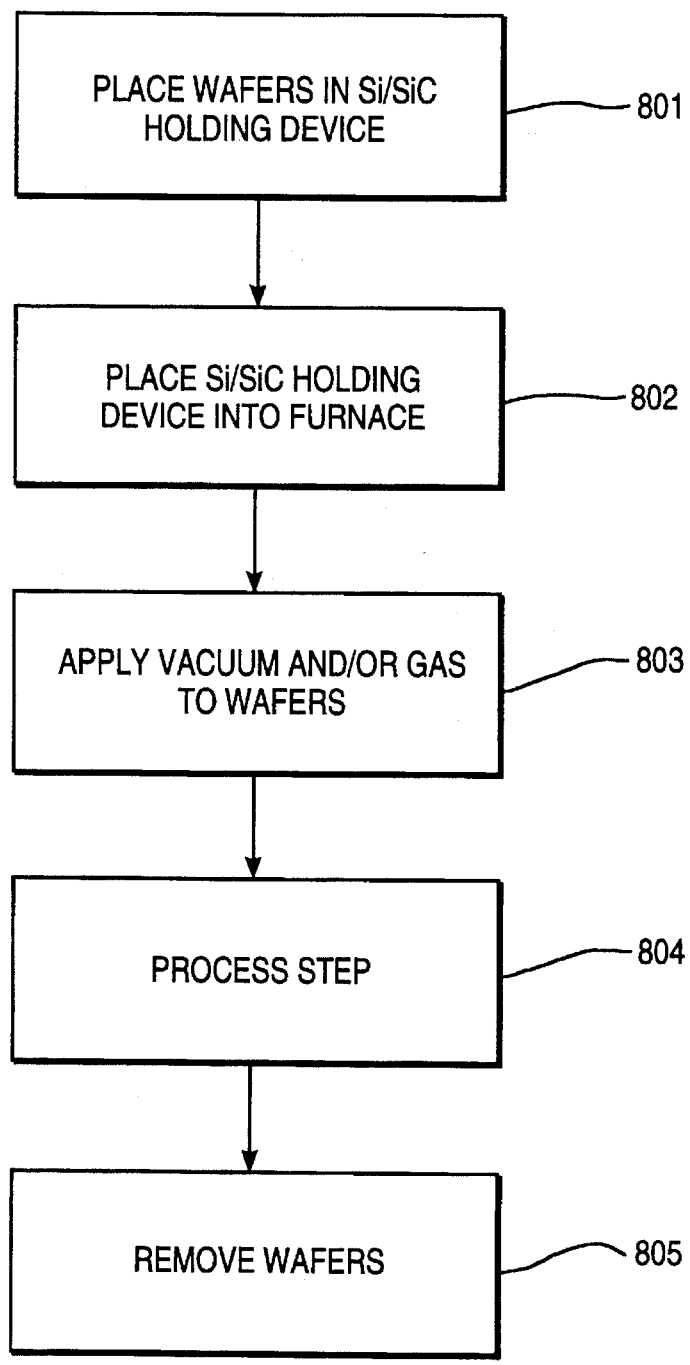
FIG_8

SI/SIC COMPOSITE MATERIAL AND METHOD FOR MAKING SI/SIC COMPOSITE MATERIAL

This is a divisional of application Ser. No. 08/128,839, filed Sep. 29, 1993, U.S. Pat. No. 5,417,803.

BACKGROUND

1. Field of the Invention

The present invention relates to the field of semiconductor processing materials, and more specifically to a material and a method of manufacturing parts which have minimal outgassing and minimal wafer contamination during high temperature thermal steps.

2. Background of Invention

Prior art components used in high temperature semiconductor processing applications which directly contact wafers have typically been made from quartz. Quartz is clean and cheap, but it lacks the mechanical stability required to support large loads of semiconductor wafers. As wafers which are larger and heavier are being used within the industry, quartz is less desirable as a material due to its lack of strength, and particularly its lack of strength during high temperature operations. Also, quartz components have a relatively short lifetime due to warpage. Warpage of the quartz components causes the dimensions of the quartz component to deviate from the strict dimensions required for robotic handling. In addition, vertical furnaces are increasingly being used in semiconductor processing applications. The structural strength required by vertical furnace components are greater than those required for horizontal furnace components.

One solution for the lack of structural strength of quartz components is to use silicon impregnated silicon carbide (Si/SiC) composite materials. Though Si/SiC composite materials have the necessary structural strength for furnace applications, these materials typically suffer from problems associated with contamination. One form of contamination is outgassing. Outgassing is the release of vapors from the material during high temperature process steps. These vapors contain contaminating species which contaminate the wafers being processed. Furthermore, direct contamination of wafers may occur when the wafer comes into direct contact with a Si/SiC component. In the semiconductor wafer processing industry the cleanliness of wafers is a major issue. Even small amounts of impurities can create defects within the integrated circuits formed upon the wafer.

One way that manufacturers have overcome this problem is to use assemblies of components which include wafer holding "cantilevers" and "liners" which are made from Si/SiC in conjunction with quartz wafer holding containers or "boats." In these assemblies, the wafers never directly contact Si/SiC material, and the assembly has the necessary structural strength due to the structural strength of the Si/SiC parts. This approach works well with horizontal furnaces. However with vertical furnaces this approach is not feasible due to design considerations. These design considerations include, in particular, the space restrictions within the furnace and the need to design an assembly which has the necessary structural strength, is compact, durable and easy to manufacture.

Thus, it is desirable to use components made of Si/SiC which may be used in both horizontal and vertical furnaces. The design of these components may incorporate direct contact between the Si/SiC material and the wafers to be processed. This contact causes direct contamination of wafers at those portions of the wafer which touch the Si/SiC materials. This direct contact in conjunction with the outgassing associated with prior art Si/SiC material give unacceptable contamination of wafers.

Though 99.99% pure silicon carbide and electronic grade (99.9999 or better) silicon impregnate may be used to make the Si/SiC component parts, the level of metallic impurities is still to high for future and even current integrated circuit manufacturing requirements.

One cleaning method integrates a wet or dry etch process for cleaning the SiC matrix after sintering to reduce the level of impurities. This method may include the use of a mixture of acids such as HF, $HNO_3$, and HCl. These methods seek to dissolve impurities on or near the surface. These methods are not effective since the SiC does not react with acids.

In an effort to further reduce the level of impurities outgassing into the furnace atmosphere, manufacturers have used high temperature post-process treatment or protective coatings. Both of these options have a limited lifetime. However, the use of coatings is less than a satisfactory solution as the effectiveness is highly dependent on the quality of the coating and since outgassing may occur through pin-holes and grain boundaries, outgassing from the exposed Si/SiC material is not entirely eliminated. Furthermore, the coating has a limited lifetime and peeling of the coating presents micro-contamination problems in terms of particulates. High temperature post-process treatments typically involve running the parts through a series of high temperature cycles so as to induce outgassing before the parts are used in conjunction with wafer processing. As these steps merely remove a small amount of the impurities just from the surface layers, they are not satisfactory.

Though these methods are effective in partially decreasing outgassing for at least some period of time, none of these methods yield a material which is clean enough for direct contact with wafers or a material which will not outgas over the useful life of the Si/SiC component. What is needed is a method for forming Si/SiC composite materials which do not outgas during heat process steps and which are clean enough to allow for direct contact between the manufactured parts and wafers.

SUMMARY OF INVENTION

With conventional Si/SiC components the amount of contamination outgassing from the SiC grains decreases as a function of the number of thermal cycles and eventually slows down such that, after the first few thermal cycles, the impurities contained within the SiC grains will not outdiffuse within the normal lifetimes of parts used in IC manufacturing processes. A large portion of the metallic impurities which are on the surface of the SiC grains are absorbed into the silicon fill upon the sintering steps, and upon the first few thermal cycles. Thus, after the first few thermal cycles contamination primarily results from impurities located within the silicon fill.

A process is disclosed for making a ultraclean Si/SiC material which includes the removal of the silicon filling between the Si/SiC grains after the contaminants are allowed to move from the surface of the SiC grains to the silicon fill. A new clean silicon filling is then impregnated into the Si/SiC part. This yields an impregnated Si/SiC composite material which has little, if any outgassing during thermal processing steps and which has few metallic impurities on its surface. This is due to the fact that the Si/SiC will have a negligible amount of "available" impurities for outdiffusion. These parts may be, for example, boats, cantilevers, tubes, liners, pedestals, baffels, pins, and other components which are used in IC manufacturing processing steps.

First, Si/SiC material having silicon filling in the pore spaces between SiC grains is formed. While cooling down, the part will then be held at a high temperature for a period of time long enough for the metallic species at or near surface of the SiC grain to diffuse into, and react with the silicon fill. Next, the contaminated silicon is removed from the Si/SiC part. This removal may be accomplished by either a high temperature evaporation process or an etch step or a combination of an evaporation process and etch step. An etch may be accomplished by the use of a $HF/HNO_3$ acid bath. Next, a clean filling of silicon is deposited in the same manner as that of the first impregnation of silicon within the pore space of the SiC matrix. Since the contaminated silicon has been removed, and since most of the impurities located on or near the surface of the SiC grains have been removed, an ultraclean Si/SiC part is produced.

Though prior art parts may be made from high purity components such as highly pure SiC and high pure Si, since the sintering step causes outdiffusion of contaminants, the part which results is not of an ultraclean material.

One major advantage of the present invention is the fact that preexisting Si/SiC components may be processed by the methods disclosed in the present invention so as to yield ultraclean parts. Thus, ultraclean parts may be obtained easily and inexpensively without the need for manufacturing all new parts. Significant time and cost savings may thus be readily achieved.

An additional advantage of the present invention is that the proposed cleaning concept takes care of the extractable/ available impurities on or near the surface more effectively than the traditional wet or dry technique which seeks to dissolve impurities from a very chemically stable SiC structure. Furthermore, quality testing of Si/SiC parts is quite difficult as Si/SiC is a difficult material to characterize due to its inhomogenity and its chemical inertness. Si/SiC can be easily characterized for its cleanliness by analyzing just the Si fill. This allows for easy testing of components by analyzing the Si fill removed from a test component or a coupon.

BRIEF DESCRIPTION OF THE DRAWINGS

The present invention is illustrated by way of example and not limitation in the figures in the accompanying drawings and in which like numbers indicate similar elements and in which:

FIG. 1 is a schematic diagram of a cross-sectional view of a vertical furnace including a wafer boat containing semiconductor wafers;

FIG. 2 is an schematic diagram of a cross-sectional view of a horizontal furnace for use in semiconductor process applications;

FIG. 3 is a schematic diagram illustrating the process steps for forming an ultraclean Si/SiC material;

FIG. 4 is a cross-sectional view showing the SiC grains;

FIG. 5 is a cross-sectional view showing the structure of FIG. 4 after impregnation of the sacrificial layer;

FIG. 6 is a cross-sectional view showing the structure of FIG. 5 after etch of the sacrificial layer;

FIG. 7 is a cross-sectional view showing the structure of FIG. 6 after impregnation of silicon; and FIG. 8 is a diagram illustrating wafer processing steps using ultraclean Si/SiC components.

DETAILED DESCRIPTION OF THE PREFERRED EMBODIMENT

In the following description numerous specific details are set forth such as dimensions, materials, thicknesses, temperature, etc., in order to provide a thorough understanding of the present invention. However, it will be obvious to one skilled in the art that the invention may be practiced without these specific details. In other instances well known processing techniques, materials, etc. have not been shown in detail in order to avoid unnecessarily obscuring the present invention.

FIG. 1 illustrates a cross-sectional view of a vertical furnace. This furnace may be used for high temperature process steps performed on semiconductor wafers. Within the furnace frame 1 are heating elements 2 located such that heat may be transferred through liner 3 and into process tube 4 so as to heat items which may be placed within the process tube 4. Process tube 4 is sealed on one end by furnace frame sealing section 12. Liner 3 is shown to lie between process tube 4 and heating elements 2. A vertical holding fixture such as vertical boat 5 is used to hold a number of semiconductor wafers. Vertical boat 5 is supported by a pedestal 11 which lies over sealing section 12. Vertical boat 5 is shown to have a number of slots such as slots 6 which hold semiconductor wafers. Semiconductor wafer 7 and semiconductor wafer 8 are shown to be held by slots 6 within the vertical boat 5. The process tube 4 is shown to have an opening to which gas inlet 9 is affixed. The gas inlet 9 allows for a vacuum to be formed within the confines of the process tube 4 and allows for gases to be injected into the region within the process tube 4 such that those gases may contact semiconductor wafers located on the vertical holding fixture before and during process steps. Gasses may exit through tube 13. These gases may be, for example, oxygen, nitrogen, chlorine, trichloroethane (TCA), dichlorol ethylene (DCE) or silane. Though only two wafers, semiconductor wafer 7 and semiconductor wafer 8 are illustrated in this diagram, preferably, a large number of silicon wafers will be processed at any one time (typically 100 to 200 wafers). Due to the size and weight of semiconductor wafers, and particularly the size and weight of the larger diameter wafers which are now being used, it can be seen that significant structural strength. is required by the vertical boat 5. This is particularly true in those situations where the vertical boat is fully loaded with wafers. As it is desirable to process as many wafers as possible within any given batch, it is particularly important to have a vertical holding fixture which will fully support the load of a large number of wafers. Furthermore, robotic handling of the wafers requires precise machining of the slots 6 within very strict tolerances. Any warpage or other movement of the vertical boat will impact functionality and thus lifetime of the vertical boat. It can be seen that each of the wafers will contact the vertical boat at that portion of each of the slots 6 which directly contacts each semiconductor wafer. This contact allows for impurities which may be located on the slots 6 to move onto the semiconductor wafers. FIG. 2 is a cross-sectional view of a horizontal furnace for use in semiconductor process applications. This horizontal furnace includes a furnace frame 90 within which heating element 70 and heating element 80 are contained. The liner 26 is located near the heating elements 70 and 80 such that heat may be conducted through the liner 26 and into the process tube 25. Boats 40–42 are shown to be placed within cantilever 20 which has sufficient structural strength for handling and carrying a number of boats. This cantilever may have the structure shown by cantilever 20. However, a cantilever may have any number of different shapes and be of any of a number of different designs. Boat 42 is shown to contain semiconductor wafers 56, 57, and 58. Semiconductor wafer 50, semiconductor 51, and semiconductor wafer 52 are shown to be placed within boat 40 and secured by slots located in that boat. Similarly, boat 41 is shown to contain semiconductor wafers 53, 54, and 55. The cantilever 20 supports and contains the boats 40–42. Though the cantilever 20 and the boats 40, 41, and 42 are shown to be separate parts, since the material and processing of the present invention allows for the formation of an ultraclean Si/SiC material, there is no requirement that they be separate components. Therefore, the boats 40, 41, and 42 may be either integrally formed within the cantilever 20 or may be affixed to the cantilever 20. The liner 26, the process tube 25, and each of the boats 40–42 are preferably made of ultraclean Si/SiC material. End plug 93 seals off one end of the process tube 25. The process tube 25 is tapered such that a gas inlet may be affixed to the process tube such as gas inlet 60. This allows for gases to be evacuated from the area which lies inside of the process tube and allows for gases to be injected into the area which lies within the process tube. This allows for the semiconductor wafers 50–58 to be exposed to gases during processing steps. These gases may be, for example, oxygen, nitrogen, chlorine, trichloroethane (TCA), dichlorol ethylene (DCE) or silane. These gasses may exit through tube 61. The furnace is enclosed on one end by ceramic block 92 and on the other end by furnace door 91.

FIG. 3 illustrates the process steps for forming an ultraclean Si/SiC material. Steps 301 through 304 are illustrated for the formation of Si/SiC components by methods which are well known to those with skill in the art. Processes and methods for forming Si/SiC components are described in U.S. Pat. No. 3,951,587 to R. Alliegro, et al., and U.S. Pat. No. 4,836,965 to K. Hayashi, et al., and in U.S. Pat. No. 4,761,134 by Foster, and in U.S. Pat. No. 2,964,823 by Fredriksson which are incorporated herein by reference. First, as illustrated by block 301, silicon carbide powder is formed. Preferably, silicon carbide powder which is at least 99.99% pure is used. A mixture of fine grain silicon carbide powder having a particle size of lower than 8 microns, and coarse grain silicon carbide powder having an average particle size larger than 30 microns is preferably used. A variety of different additive could also be included with the Si/SiC material. These additives could include, for example, carbon. SiC parts may also be formed by any of a number of known prior art methods. For example, the part may be formed by stamping, pressing, and/or rolling the silicon carbide powder prior to sintering the shape. However, more complex shapes may be easily fabricated by slip-casting. In addition, extrusion could be used to form parts.

The part is then sintered, as shown by block 302. Sintering of SiC material is well known in the art and may be performed in any of a number of ways and at any of a number of temperatures. As shown by block 302, the silicon carbide powder is then sintered by applying a temperature of between 1800° centigrade and 2250° centigrade for a time period of time from 10 minutes to 6 hours. The sintering is preferably performed at a heat of approximately 2000° C. and for a time of two hours. The sintering step is preferably performed either in a vacuum or in an inert gas environment. The inert gas may be, for example, nitrogen. Preferably, sintering is accomplished such that a porous bimodal silicon carbide matrix results. Preferably a 20–30% porosity is achieved. The sintering process combines the grains together so as to form an extremely strong structure.

An example of the structure which results from the sintering of the silicon carbide grains can be seen in FIG. 4. It can be seen that the silicon carbide grains 101 have pore space which is located between those grains such as pore space 402. This pore space is undesirable as it allows for impurities to enter within the structure of the silicon carbide material. These impurities may either outgas, or they may directly contaminate wafers.

Next, as shown by block 303 of FIG. 3, silicon is impregnated into the SiC material. This silicon fills the pore space between the grains. The resulting material is a strong silicon carbide material with silicon fill (Si/SiC). The methods for silicon impregnation of SiC are well known to those with skill in the art. In the present invention, this impregnation is preferably performed at a temperature of about 2150° centigrade by exposing the SiC body to silicon vapor. Silicon may be impregnated using capillary and/or gravity impregnation or impregnation using silicon vapors (CVI). Another method for silicon impregnation is emersion of the silicon carbide shape into liquid silicon. The resulting form will preferably have a silicon composition of between 5 and 35 percent by weight of the silicon fill.

FIG. 5 illustrates the structure shown in FIG. 4 after the impregnation of silicon into the pore space between the SiC grains. It can be seen that silicon 503 is disposed within the pores between silicon carbide grains 101. This silicon is a sacrificial silicon since, as described below, it will subsequently be removed.

As illustrated by block 304 of FIG. 3, the SiC material is then subjected to a high temperature process step. This high temperature process step may be performed in any of a number of different manners and at any of a number of different temperatures. It may be performed over a short period of time or a long period of time. However, longer periods of time give additional movement of impurities from SiC grains to the silicon fill. Any temperature above 600° C. will accomplish species diffusion. However, preferably this process step is performed at a temperature of between 1100° C. and 1300° C. for a period of time long enough to impregnate the silicon with the out diffusing species. Typically 12 to 16 hours is sufficient. This step moves from 60% to 90% of the impurities from the surface of the SiC grains into the silicon.

Though a separate and distinct heating step may be used to cause movement of the impurities located on the surface of the SiC grains into the silicon fill, preferably this step is combined with the preceding step such that the material is not completely cooled until the end of the high temperature step 304. This may be done, for example, by first performing the impregnation step 303 and then performing step 304 during the cool-down of the component after impregnation step 303.

Next, as shown by block 305 of FIG. 3, the structure is subjected to a silicon removal step so as to remove the silicon which contains the impurities received from the SiC grains. This step could be either a chemical etch or a heat evaporation step. A chemical etch is preferably used to remove the silicon and the impurities which are contained within the silicon. This chemical etch may be accomplished, for example, by using a hydrofluoric and nitric acid bath (HF/NHO$_3$). The part is placed into a mixture having a ratio of 1 to 4 of HF to HNO$_3$ at room temperature for a period of time of 8 to 16 hours. HF is preferably 49% and the HNO$_3$ is 70% by weight. The pan is then dried in a nitrogen gas environment. A temperature of between 60° C. and 100° C. is preferably maintained throughout the drying process. Though the use of a HF/HNO$_3$ acid bath is described, any of a number of different etchants could be used. These etchants may be, for example, other combinations of HF and NHO$_3$, or HF and nitric acid (NHO$_3$), hydrochloric acid (HCl), or sulfuric acid (H$_2$SO$_4$), and glacial acetic acid. Also, base types of etchants such as sodium hydroxide (NaOH), or potassium hydroxide (KOH), or organic based bases such as thorinc may be used. The etch step may be performed at high temperatures and pressures, and agitation, ultrasound, or megasound could be used to facilitate the etch process.

In those situations where heat evaporation process is desired, the component is heated to a temperature sufficient to evaporate the silicon such that the silicon may be removed as vapor. In a heat evaporation step, a temperature of 1800° C. to 2250° C. may be used to evaporate the contaminated silicon fill.

FIG. 6 illustrates the structure of FIG. 4 after a silicon removal step has removed the sacrificial silicon filling from the pore space which lies between the SiC grains 101. It is desirable to remove all of the sacrificial silicon filling if possible. However, depending on the efficiency of the silicon removal step, there will usually be some residual pocket of contaminated silicon such as residual pocket 601 and residual pocket 602.

Next, as shown by block 306 of FIG. 3 a second fill of silicon is impregnated into the structure. This silicon impregnation step may be done in the same manner as disclosed with reference to the first impregnation step, illustrated as step 303. Thus, impregnation may be achieved by exposing the SiC body to silicon vapor at a temperature of 2150° centigrade. This step results in a material which does not outgas over the useful life of the component and which does not directly contaminate wafers as a result of impurities on the silicon carbide matrix or in the silicon fill. This ultraclean material has a lower quantity), of material diffusing out of the filling as compared to that of prior art Si/SiC components. For example, the ultraclean material has an amount of each of sodium, aluminum and iron diffusing from the silicon fill which is 60–90% less than the diffusion of that element in prior art materials.

The structure which may, result from the silicon impregnation is illustrated in FIG. 7. It can be seen that the pore space between the SiC grains 101 is now filled with silicon 701. However, residual pockets of silicon from the first silicon impregnation may remain such as residual pocket 601 and residual pocket 602.

As the impurities from the surface of the silicon carbide grains have been removed and the impurities diffused into the silicon fill have been removed, an ultraclean material which provides minimal contamination and minimum outgassing is obtained. The structure which is obtained is referred to as an ultraclean material. Though impurities may remain within the interior of the SiC grains these do not readily move onto the surface of the SiC grains or into the silicon or onto any adjoining surfaces as those impurities which will move have already been removed by the high temperature step 304. Furthermore, the silicon fill which remains is highly pure. This material will stay ultraclean in spite of continued high temperature cycles due to the fact that the impurities located on or near the SiC grain surfaces have been removed. For example, the diffusivity at 1300° C. of iron (Fe) in SiC grains is on the order of $10^{-12}$ cm$^2$/second or less which may be compared to a diffusivity of iron of $10^{-7}$ cm$^2$/second in Si fill of Si/SiC. The diffusivity of sodium (Na) for SiC grains is between $10^{-12}$ and $10^{-13}$ cm$^2$/second as compared to Si fill of Si/SiC sodium diffusivity of $10^{-8}$ cm$^2$/second. A further example is the diffusivity of aluminum (Al) which is on the order of $10^{-19}$ cm$^2$/second for SiC grains and which is $10^{-12}$ cm$^2$/second for Si fill of Si/SiC material.

A method for processing semiconductor wafers during fabrication steps using ultraclean Si/SiC parts is illustrated in FIG. 8. These fabrication steps which use high temperature may be oxidation, diffusion or CVD processes. These processes may include the deposition of, for example, nitride, polysilicon, or low temperature glass. First, the wafers are placed in a ultraclean Si/SiC wafer holding device, block 801. The structure of the wafer holding device is such that there will be some actual contact between the surfaces of the wafer and the Si/SiC holding device. The ultraclean Si/SiC holding device and the wafers are then inserted into a furnace, block 802. This furnace includes heating elements and may include an ultraclean Si/SiC liner and an ultraclean Si/SiC process tube. Gases may then be injected into the process tube and/or a vacuum may be established, block 903. The entire system is typically heated to IC manufacturing process temperatures ranging from 400° C. to 1200° C., depending on the particular process step. The integrated circuit process step then is performed which may be, for example, the deposition of a layer of material upon the semiconductor wafer surface, block 904. The semiconductor wafers are then removed from the furnace so as to complete the process step, block 905.

In this manner semiconductor wafers may be subjected to elevated temperature process steps easily and efficiently. Furthermore, a one-piece holding boat may be used to secure the semiconductor wafers, eliminating the need for assembling multiple components made of different materials. As the ultraclean Si/SiC material eliminates outgassing and direct contamination, the impurities within the Si/SiC material will not damage the wafers either by outgassing or by direct contact.

We claim:

1. A system for semiconductor wafer processing comprising:

a furnace, said furnace including a frame, a plurality of heating elements and provision for disposing gases into said furnace;

an ultraclean silicon and silicon carbide process tube attached to said frame of said furnace such that said heating elements are disposed in close proximity to said ultraclean silicon and silicon carbide process tube, said ultraclean silicon and silicon carbide process tube coupled to said provision for disposing gases into said furnace so as to allow for the disposition of gases into said ultraclean silicon and silicon carbide process tube;

an ultraclean silicon and silicon carbide holding apparatus having provision for holding semiconductor wafers;

wherein a plurality of semiconductor wafers may be loaded directly onto said ultraclean silicon and silicon carbide semiconductor wafer holding apparatus and said ultraclean silicon and silicon carbide semiconductor wafer holding apparatus may be placed into said ultraclean silicon and silicon carbide process tube such that heat and gas may be applied to said semiconductor wafers such that contamination of said wafers is minimized; and wherein said ultraclean silicon and silicon carbide process tube and said ultraclean silicon and silicon carbide semiconductor wafer holding apparatus of said system are formed by an ultraclean process comprising: forming a silicon carbide matrix, filling at least some portion of said silicon carbide matrix with a sacrificial filling, heating said silicon carbide matrix such that said sacrificial filling absorbs the impurities from said silicon carbide matrix, removing at least some of said sacrificial filling, and filling at least some of the portions of said silicon carbide matrix where said sacrificial filling has been removed with silicon.

2. The system of claim 1 wherein said furnace further comprises an ultraclean Si/SiC liner, said ultraclean Si/SiC liner formed by said ultraclean process.

3. The system of claim 2 wherein said wafer holding apparatus comprises an ultraclean Si/SiC cantilever, said ultraclean Si/SiC cantilever formed by said ultraclean process.

4. The system of claim 3 wherein said wafer holding apparatus defines a boat.

5. The system of claim 3 wherein said wafer holding apparatus defines a vertical holding fixture.

* * * * *

UNITED STATES PATENT AND TRADEMARK OFFICE
CERTIFICATE OF CORRECTION

PATENT NO. : 5,494,439
DATED : February 27, 1996
INVENTOR(S) : Goldstein et al.

It is certified that error appears in the above-identified patent and that said Letters Patent is hereby corrected as shown below:

In the Abstract at [57] in line 3 delete "pans" and insert --parts--

In the Abstract at [57] in line 12 delete "pan." and insert --part.--

In column 6 at line 23 delete "earbide" and insert --carbide--

In column 6 at line 65 delete "(HF/NHO$_3$)." and insert --(HF/HNO$_3$).--

In column 7 at line 1 delete "pan" and insert --part--

In column 7 at line 6 delete "NHO$_3$," and insert --HNO$_3$,--

In column 7 at line 8 delete "(NHO$_3$)," and insert --(HNO$_3$),--

In column 7 at line 11 delete "thorinc" and insert --chorine--.

Signed and Sealed this

Fourth Day of February, 1997

Attest:

BRUCE LEHMAN

*Attesting Officer*  *Commissioner of Patents and Trademarks*